United States Patent [19]
Okano et al.

[11] Patent Number: 5,408,203
[45] Date of Patent: Apr. 18, 1995

[54] SWITCHING BOOSTING CIRCUIT HAVING INTERNALLY CONTROLLED DUTY

[75] Inventors: Masami Okano; Norio Matsuda, both of Tomioka, Japan

[73] Assignee: Airbag Systems Company Ltd., Gumma, Japan

[21] Appl. No.: 124,545

[22] Filed: Sep. 22, 1993

[30] Foreign Application Priority Data

Oct. 1, 1992 [JP] Japan .............................. 4-074431 U

[51] Int. Cl.$^6$ .............................................. H03K 3/00
[52] U.S. Cl. .................................... 331/143; 331/183; 323/222
[58] Field of Search ................... 331/143, 74, 75, 182, 331/DIG. 3, 183; 307/268, 266, 267; 323/222, 259, 344

[56] References Cited
U.S. PATENT DOCUMENTS 3,869,660 3/1975 Davis et al. ............................ 323/17
4,584,517 4/1986 Schwob ................................ 323/222

Primary Examiner—Robert J. Pascal
Assistant Examiner—David Vu
Attorney, Agent, or Firm—Sughrue, Mion, Zinn, Macpeak & Seas

[57] ABSTRACT

A switching boosting circuit including a clock oscillating circuit having a Schmitt trigger inverter, a boosted-voltage inducing circuit which is actuated in a switching-operation mode in response to the output clock of the clock oscillating circuit to induce a boosted voltage, a capacitor which is charged by the boosted voltage from the boosted-voltage inducing circuit to store energy to be supplied to a load, and a feedback path for feeding back current whose intensity corresponds to the load from the capacitor to the clock oscillating circuit. The feedback current acts such that the duty ratio of the switching operation is set to be smaller than a predetermined reference duty ratio, and the feedback path includes a Zener diode for reducing the boosted voltage below a predetermined value.

5 Claims, 1 Drawing Sheet

SWITCHING BOOSTING CIRCUIT HAVING INTERNALLY CONTROLLED DUTY

BACKGROUND OF THE INVENTION

1. Field of the Invention

This invention relates to a boosting circuit which is designed in a switching regulator structure.

2. Description of the Related Art

In general, a boosting circuit designed in a switching regulator structure has been frequently provided to a control circuit or a fault (failure) diagnosis circuit for a safety device such as an air bag for a vehicle. The reason for this is as follows. In order to enable actuation of such a device even when a battery voltage for the device is lowered due to a fault or other matters, sufficient energy is required to be stored in an electrolytic capacitor, and in this case the stored energy W is increased as a voltage V is heightened, as represented by an equation $W = \frac{1}{2} CV^2$.

A boosting circuit (booster) used in the above application field has been conventionally designed to have such sufficient performance that it is also effectively applicable to another application field as a power source circuit, and has various advantages that the control precision for an output is excellent, an output is less fluctuated with load variation, a large amount of current can be obtained, etc.

However, the above performance of the boosting circuit which has been conventionally used does not provide a sufficient merit to an air bag control unit or the like which serves as a relatively low load. Further, in the application field to the vehicles as described above, a conventional boosting circuit has a large ON-duty for a switching operation, and thus it has large rush current in a switch-on operation. Therefore, the conventional boosting circuit frequently has large noises because of its large On/Off current, and thus a countermeasure for preventing affection of the noises on an Electro-Magnetic Compatibility (EMC) must be separately provided. The circuit construction for obtaining the above performance which is not required for the air bag control unit or the like is more complicated, and thus the cost of the boosting circuit having such a complicated circuit construction is high.

SUMMARY OF THE INVENTION

An object of this invention is to provide a boosting circuit having a switching regulator structure which can be suitably used for an applied equipment such as an air bag control unit for a vehicle, serving as a relatively-low load, does not require high output precision, but requires exclusion of occurrence of noises, and which can be implemented with a relatively simple construction and in a relatively low cost.

In order to attain the above object, the switching boosting circuit according to this invention includes a clock oscillating circuit having a Schmitt trigger inverter, a boosted-voltage inducing circuit which is actuated in a switching-operation mode in response to the output clock of the clock oscillating circuit to induce a boosted voltage, a capacitor which is charged by the boosted voltage from the boosted-voltage inducing circuit to store energy to be supplied to a load, and a feedback path for feeding back a current of intensity corresponding to the load from the capacitor to the clock oscillating circuit, the feedback current acting such that the duty ratio of the switching operation is set to be smaller than a predetermined reference duty ratio, wherein the feedback path includes a Zener diode for reducing the boosted voltage below a predetermined value.

According to the boosting circuit of this invention, the Schmitt trigger inverter is used for the clock oscillating circuit which is actuated in a switching-operation mode, and the feedback path for feeding back the output from the clock oscillating circuit is provided to make the duty ratio of the clock oscillating circuit variable. The zener diode disposed in the feedback path is used to regulate the output voltage of the boosting circuit to be substantially constant. Therefore, in comparison with a conventional boosting circuit, the boosting circuit of this invention can be designed in simple structure and high cost although its output precision is low. The current fed back through the feedback path to the clock oscillating circuit acts such that the duty ratio is set to be smaller than the predetermined reference duty ratio (in the following embodiment, 50%) to prevent the duty ratio from exceeding the reference duty ratio, so that the ON/OFF current in the switching operation is limited to be below a predetermined value, and noises can be suppressed.

DETAILED DESCRIPTION OF THE PREFERRED EMBODIMENT

A preferred embodiment according to this invention will be described with reference to the accompanying drawings.

Figure 1:
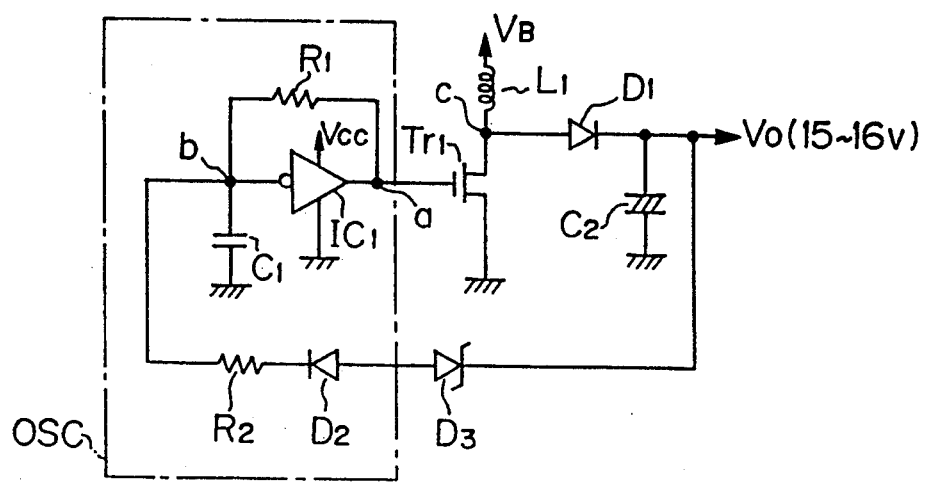
FIG. 1 is a circuit diagram for an embodiment of a boosting circuit according to this invention.

FIG. 1 is a circuit diagram showing an embodiment of a boosting circuit according to this invention.

Figure 2:
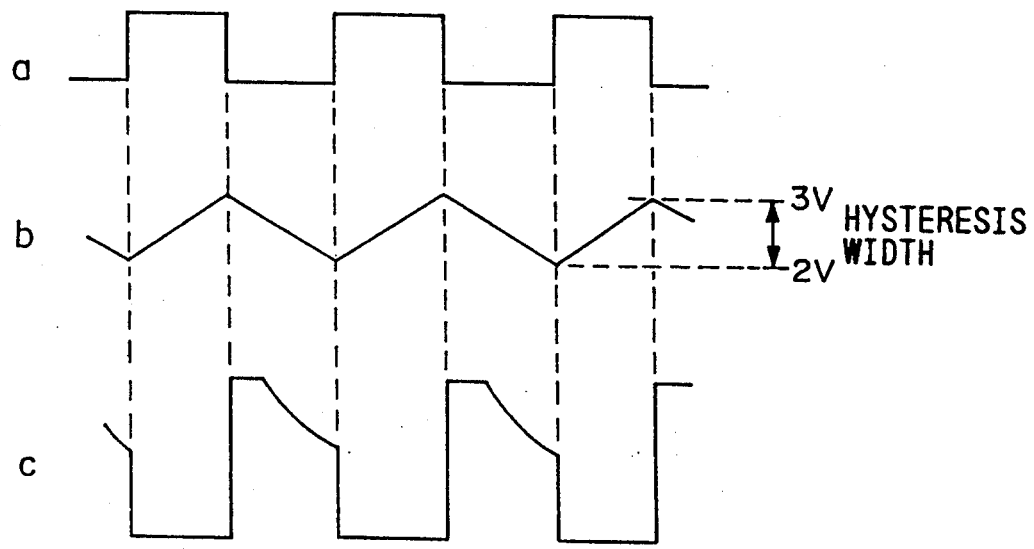
FIG. 2 is an output-waveform diagram showing the operation of the boosting circuit of the embodiment.

In FIG. 1, a portion surrounded by a one-dotted chain line corresponds to an oscillating circuit (OSC) having variable duty ratio. The oscillating circuit OSC includes a Schmitt trigger inverter IC1 of CMOS, and the hysteresis of the inverter IC1 is set to have a width range of about ±0.5 V at the center of 2.5 V, that is, has an upper (maximum) level of about 3 V and a lower level (minimum) level of about 2 V as shown in FIG. 2. A feedback resistor R1 is connected across the input and output terminals of the Schmitt trigger inverter IC1, and a capacitor C1 is connected across the input terminal of the Schmitt trigger inverter IC1 and the ground, thereby forming the oscillating circuit which is oscillated by repetitive charging and discharging operations of the capacitor C1 through the feedback resistor R1.

The output point a of the clock oscillating circuit is connected to a control gate of a switching transistor (FET) Tr1 to actuate the transistor Tr1 in a switching operation mode.

A source/drain path of the transistor Tr1 is connected across the ground and one terminal of a switching coil L1, the other terminal of the switching coil L1 being connected to a battery VB, and the mutual connection point C between the switching coil L1 and the transistor Tr1 is connected through a backflow preventing diode D1 to one terminal of an electrolytic capacitor C2 for storing energy. The other terminal of the electrolytic capacitor C2 is connected to the ground.

A high voltage which is induced through the switching operation of the transistor Tr1 is supplied through the diode D1 to the capacitor C2, that is, the energy stored in the coil L1 is transmitted through the diode D1 to the capacitor C2 to charge the capacitor C2. The charge voltage of the capacitor C2 is subsequently extracted as a boosted output voltage V0, and output to an air bag control circuit for a vehicle, for example.

The boosted output voltage V0 is fed back through the Zener diode D3 to the clock oscillating circuit OSC as described above. That is, the output terminal for supplying the output voltage V0 is connected through the Zener diode D3, a backflow preventing diode D2 and a current limiting resistor R2 to the input terminal b of the clock oscillating circuit in series.

Accordingly, the output voltage V0 is regulated in amplitude to be substantially equal to the sum value (for example, from 15 V to 16 V) of the voltage at the input terminal b of the clock oscillating circuit (varying from about 2 to 3 V) and the Zener voltage of the Zener diode D3.

In addition to the above operation, the current whose intensity is varied in accordance with the magnitude of a load for the boosting circuit is fed back from the capacitor C2 to the input terminal b of the clock oscillating circuit to charge the capacitor C1, so that the charging and discharging time of the capacitor C1 is made variable. With this effect, the duty ratio of the output clock of the clock oscillating circuit is automatically varied to thereby enable automatic adjustment of the charging and discharging speed of the electrolytic capacitor C2 in accordance with the load.

Figure 3:
FIG. 3 is an output-waveform diagram showing the operation of the boosting circuit of the embodiment when a load is reduced.

The operation of the boosting circuit thus constructed will be next described with reference to FIGS. 2 and 3.

FIG. 2 is an output waveform diagram of each point (a,b,c) when the boosting operation is terminated and the feedback current from the electrolytic capacitor C2 is substantially equal to zero. In this state, the output of the oscillating circuit becomes a clock pulse having duty ratio of 50% as shown by the waveform at the point a of FIG. 1 because the charging and discharging operations of the capacitor C1 of the oscillating circuit are repeated at the same period as shown by the waveform at the point b. When the clock pulse is in a low level, that is, the switching transistor Tr1 is switched off, a boosted voltage as shown by the waveform at the point C is induced at the output terminal C point of the coil L1 to charge the electrolytic capacitor C2. At that time, a part of the output voltage of the electrolytic capacitor C2, which exceeds the voltage value of 15 to 16 V as described above, is cut off by the action of the Zener diode D3. That is, the boosted output voltage V0 is regulated to be equal to the voltage value of 15 to 16 V.

If the load is decreased more than that in the above state, the feedback current would flow from the electrolytic capacitor C2 to the oscillating circuit, so that the charging time of the capacitor C1 in the oscillating circuit is shortened, whereas the discharging time is lengthened. Therefore, as shown in FIG. 3, the duty ratio of the output clock of the oscillating circuit becomes small, so that the On-time of the transistor Tr1 is shortened and the energy to be stored in the coil L1 during the ON-time of the transistor Tr1 is reduced. Therefore, the flow-in energy into the electrolytic capacitor C2 is also reduced.

If the load is increased more than that in this state, the feedback current is reduced and the duty ratio of the oscillating clock is increased, so that the flow-in energy into the electrolytic capacitor C2 is also increased.

Through the above operations, the duty ratio in the switching-regulating operation is varied in accordance with the magnitude of the load, and the output voltage of the boosting circuit is kept to be substantially constant.

In this case, even when the load is increased and the duty ratio is heightened, the duty ratio is limited to 50% at maximum. Therefore, when the load is further increased, the reduction of the output voltage V0 occurs. However, the limitation of the duty ratio to the value below 50% causes the ON/OFF current to be also limited below a corresponding value, and thus the noises are also suppressed. Therefore, the above effect provides a great merit to an applied equipment such as an air bag control circuit for a vehicle in which affection of noises on an EMC must be prevented.

In addition, since such an applied equipment does not require high output precision and its load is low, the embodiment of this invention has an advantage that a sufficient desired performance can be provided in simple construction and low cost.

As described above, according to this invention, a boosting circuit having a switching regulator structure with suppressed noises can be provided in relatively simple construction.

What is claimed is:

1. A switching boosting circuit having internally controlled duty cycle comprising:
    oscillating means having a Schmitt trigger inverter coupled to a first capacitance means for producing a clock pulse responsive to a charge period of said first capacitance means;
    voltage boosting means which is actuated in a switching-operation mode in response to the output clock pulse of said oscillating means to induce a boosted voltage;
    a second capacitance means which is charged by the boosted voltage from said voltage boosting means to store energy to be supplied to a load; and
    feedback means for feeding back a current variable in accordance with the load from said second capacitance means to said first capacitance means to vary said charge time and limit said switching operation to be smaller than a predetermined reference duty ratio.

2. The switching boosting circuit as claimed in claim 1, wherein said voltage boosting means comprises a switching transistor which is actuated in a switching operation mode, and a coil for inducing the boosted voltage on the basis of the switching operation of said switching transistor.

3. The switching boosting circuit as claimed in claim 2, wherein said capacitance means comprises an electrolytic capacitor.

4. The switching boosting circuit as claimed in claim 1, wherein said feedback means includes a Zener diode for reducing the boosted voltage below a predetermined value, a backflow preventing diode and a current limiting resistor for feeding back the voltage below the predetermined value to said oscillating means.

5. A switching boosting circuit comprising:

a clock oscillating circuit having a Schmitt trigger inverter coupled to a first capacitor having a defined charge period;

a boosted-voltage inducing circuit which is actuated in a switching-operation mode in response to the output clock of said clock oscillating circuit to induce a boosted voltage;

a second capacitor which is charged by the boosted voltage from said boosted-voltage inducing circuit to store energy to be supplied to a load; and a feedback path for feeding back current whose intensity corresponds to the load from said second capacitor to the first capacitor for correspondingly changing said charge period and limit the duty ratio of the switching operation to be smaller than a predetermined reference duty ratio, wherein the feedback path includes a Zener diode for reducing the boosted voltage below a predetermined value.

* * * * *